US012673377B2

(12) United States Patent
    Dautenhahn

(10) Patent No.: US 12,673,377 B2
(45) Date of Patent: Jul. 7, 2026

(54) RADIANT CURTAIN HEATING ASSEMBLY FOR WAVE SOLDERING MACHINE

(71) Applicant: Illinois Tool Works Inc., Glenview, IL (US)

(72) Inventor: Jonathan M. Dautenhahn, Lake Ozark, MO (US)

(73) Assignee: Illinois Tool Works Inc., Glenview, IL (US)

( * ) Notice: Subject to any disclaimer, the term of this patent is extended or adjusted under 35 U.S.C. 154(b) by 741 days.

(21) Appl. No.: 18/157,443

(22) Filed: Jan. 20, 2023

(65) Prior Publication Data

US 2024/0246162 A1     Jul. 25, 2024

(51) Int. Cl.
| | |
|---|---|
| B23K 1/08 | (2006.01) |
| B23K 1/005 | (2006.01) |
| B23K 1/008 | (2006.01) |
| B23K 3/06 | (2006.01) |
| B23K 3/08 | (2006.01) |
| B23K 101/42 | (2006.01) |

(52) U.S. Cl.
CPC .............. B23K 1/085 (2013.01); B23K 1/005 (2013.01); B23K 1/008 (2013.01); B23K 3/0653 (2013.01); B23K 3/08 (2013.01); *B23K 2101/42* (2018.08); *H05K 2203/086* (2013.01)

(58) Field of Classification Search
CPC .......... B23K 1/008; B23K 1/085; B23K 3/08; B23K 3/085; B23K 3/0646; B23K 3/0653; B23K 2101/42; H05K 2203/081; H05K 2203/086
See application file for complete search history.

(56) References Cited

U.S. PATENT DOCUMENTS

| | | | | | |
|---|---|---|---|---|---|
| 4,997,364 | A | * | 3/1991 | McGrath | .............. H05K 3/3494 |
| | | | | | 432/59 |
| 5,230,460 | A | * | 7/1993 | Deamborsio | .......... B23K 1/008 |
| | | | | | 228/180.1 |

(Continued)

FOREIGN PATENT DOCUMENTS

| | | | | | |
|---|---|---|---|---|---|
| CN | 203751480 | U | * | 8/2014 | ............. B23K 1/008 |
| DE | 102009051183 | A1 | * | 5/2011 | ............. B23K 1/008 |

(Continued)

OTHER PUBLICATIONS

International Search Report for PCT Application No. PCT/US2023/037070 filed Nov. 9, 2023.

*Primary Examiner* — Alain Chau
(74) *Attorney, Agent, or Firm* — Lando & Anastasi, LLP

(57) ABSTRACT

A wave soldering machine includes a housing, a conveyor that is movable with respect to the housing, a preheat module positioned along the conveyor, and a curtain module positioned at an entrance of the housing, the curtain module including at least one curtain and a heating element. A curtain module for a wave soldering machine or a reflow oven includes at least one curtain and a heating element. A method of containing an inert gas around a conveyor in a tunnel of a wave soldering machine or a reflow oven. In some embodiments, the method includes providing a curtain module at an end of the tunnel, the curtain module including at least one curtain and at least one heating element; and controlling a temperature of the heating element.

24 Claims, 7 Drawing Sheets

(56)              References Cited

U.S. PATENT DOCUMENTS

| | | | | |
|---|---|---|---|---|
| 5,345,061 A * | 9/1994 | Chanasyk | .............. | B23K 1/008 219/400 |
| 8,104,662 B2 * | 1/2012 | Yanaros | .............. | B23K 3/0653 228/43 |
| 2002/0061490 A1 * | 5/2002 | Yamaoka | ............. | B23K 1/0016 228/180.1 |
| 2003/0116352 A1 * | 6/2003 | Nakatsuka | ........... | B23K 3/0653 174/263 |
| 2011/0017805 A1 | 1/2011 | Yanaros et al. | | |

FOREIGN PATENT DOCUMENTS

| | | | | | |
|---|---|---|---|---|---|
| EP | 0513034 B1 * | 4/1994 | | ............. | B23K 1/085 |
| JP | H11347721 A * | 12/1999 | | ............. | B23K 1/008 |
| JP | 2018162932 A * | 10/2018 | | .............. | B23K 3/08 |
| WO | WO-2011125668 A1 * | 10/2011 | | .......... | H05K 3/3494 |
| WO | WO-2012035943 A1 * | 3/2012 | | .......... | H05K 3/3468 |

* cited by examiner

RADIANT CURTAIN HEATING ASSEMBLY FOR WAVE SOLDERING MACHINE

BACKGROUND OF THE DISCLOSURE

1. Field of the Disclosure

This application relates generally to the surface mount of electronic components onto a printed circuit board by employing a wave soldering process, and more particularly to a radiant curtain heating assembly that is configured to ensure an oxygen-free environment during the wave soldering process.

2. Discussion of Related Art

In the fabrication of printed circuit boards, electronic components can be mounted to a printed circuit board by a process known as "wave soldering." In a typical wave soldering machine, a printed circuit board is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered. As used herein, the term "circuit board" or "printed circuit board," as used herein, includes any type of substrate assembly of electronic components, including, for example, wafer substrates.

The wave soldering process has advanced by transitioning from traditional tin-lead solder to lead-free materials. These new soldering materials have reduced the process windows to the point that some processes now require pre-heating in an oxygen-free environment to prevent oxide formation on solder joints prior to the soldering process.

SUMMARY OF THE DISCLOSURE

An aspect of the disclosure is directed to a wave soldering machine of the type used to join electronic components to a substrate. In one embodiment, the wave soldering machine comprises a housing including a tunnel; a conveyor extending through the tunnel, the conveyor being configured to move workpieces through the tunnel; a preheat module positioned along the tunnel; and a curtain module positioned at an entrance of the tunnel, the curtain module including at least one curtain and a heating element.

In some embodiments, the curtain module further includes a mounting plate, each curtain of the at least one curtain being secured to the mounting plate, and the heating element being secured to the mounting plate.

In some embodiments, the heating element is a radiant heating element.

In some embodiments, the curtain module further includes an insulation layer, wherein the heating element is positioned between the insulation layer and the mounting plate.

In some embodiments, the curtain module further includes an insulation cover, wherein the insulation layer is positioned between the insulation cover and the heating element.

In some embodiments, the mounting plate has a first side and a second side opposite the first side, and each curtain is secured to the first side of the mounting plate and the heating element is secured to the second side of the mounting plate.

In some embodiments, the heating element is a radiant heating element.

In some embodiments, the at least one curtain includes a plurality of curtains.

In some embodiments, each curtain is secured to the mounting plate by at least one curtain retainer extending along a length of the respective curtain.

In some embodiments, the curtain module includes an upper curtain module subassembly positioned above the conveyor and a lower curtain module subassembly positioned below the conveyor.

In some embodiments, a curtain of the at least one curtain of the upper curtain module subassembly overlaps a curtain of the at least one curtain of the lower curtain module subassembly.

In some embodiments, each curtain of the at least one curtain is made of a material including fiberglass.

Another aspect of the disclosure is directed to a curtain module for a wave soldering machine or a reflow oven. In one embodiment of the curtain module for a wave soldering machine or a reflow oven, the curtain module comprises at least one curtain; and a heating element.

In some embodiments, the curtain module further comprises a mounting plate, each curtain of the at least one curtain being secured to the mounting plate, and the heating element being secured to the mounting plate.

In some embodiments, the heating element is a radiant heating element.

In some embodiments, the curtain module further comprises an insulation layer, wherein the heating element is positioned between the insulation layer and the mounting plate.

In some embodiments, the curtain module further comprises an insulation cover, wherein the insulation layer is positioned between the insulation cover and the heating element.

In some embodiments, the mounting plate has a first side and a second side opposite the first side, and each curtain is secured to the first side of the mounting plate and the heating element is secured to the second side of the mounting plate.

In some embodiments, the heating element is a radiant heating element.

In some embodiments, the at least one curtain includes a plurality of curtains.

In some embodiments, each curtain of the at least one curtain is secured to the mounting plate by at least one curtain retainer extending along a length of the respective curtain.

In some embodiments, the curtain module includes an upper curtain module subassembly and a lower curtain module subassembly positioned below the upper curtain module subassembly.

In some embodiments, a curtain of the at least one curtain of the upper curtain module subassembly overlaps a curtain of the at least one curtain of the lower curtain module subassembly.

In some embodiments, each curtain is made of a material including fiberglass.

Another aspect of the disclosure is directed to a method of containing an inert gas around a conveyor in a tunnel of a wave soldering machine or a reflow oven. In one embodiment of the method of containing an inert gas around a conveyor in a tunnel of a wave soldering machine or a reflow oven, the method comprises providing a curtain module at an end of the tunnel, the curtain module including at least one curtain and at least one heating element; and controlling a temperature of the at least one heating element.

In some embodiments, the at least one heating element is a radiant heating element.

In some embodiments, the curtain module includes an upper curtain module subassembly positioned in the tunnel above the conveyor and including a first heating element of the at least one heating element, and a lower curtain module subassembly positioned in the tunnel below the conveyor and including a second heating element of the at least one heating element, and the method, and controlling the temperature of the heating element includes controlling a first temperature of the first heating element and controlling a second temperature of the second heating element.

In some embodiments, the first temperature and the second temperature are not equal.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
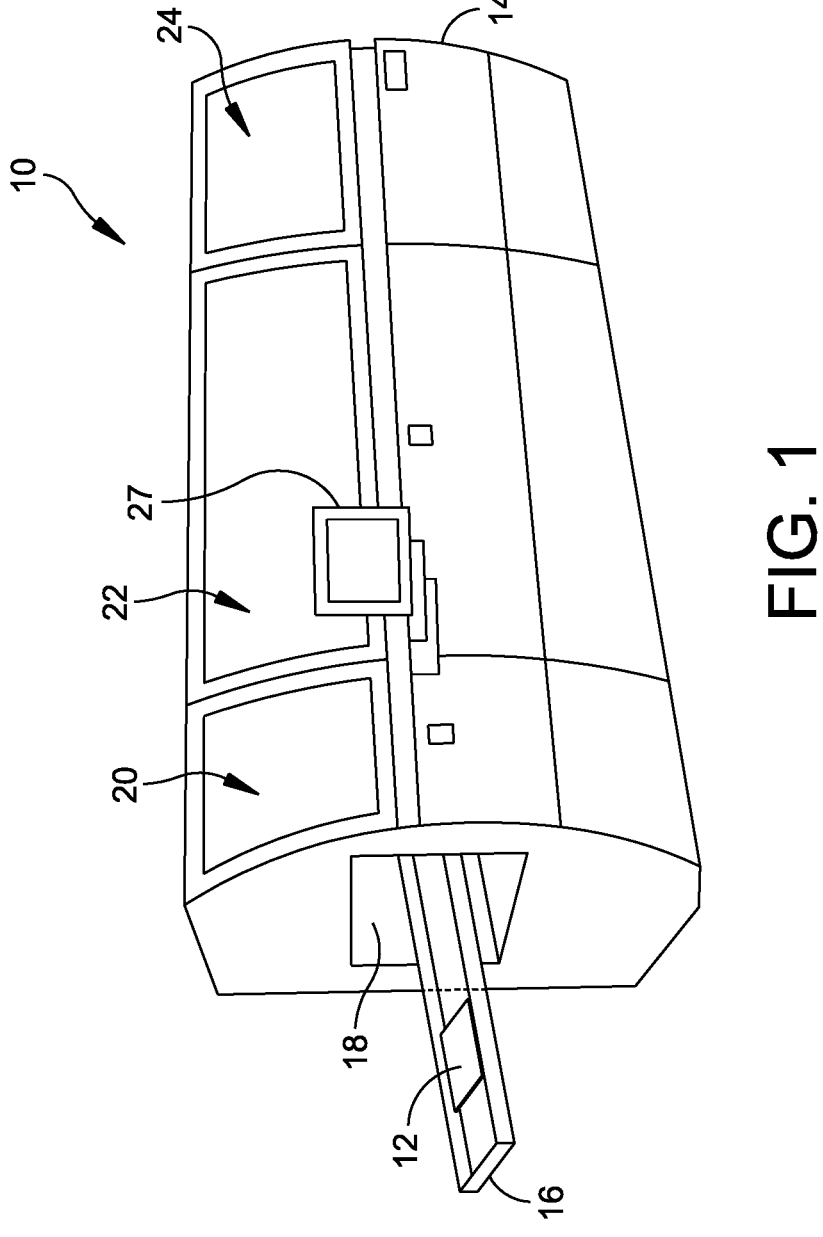
FIG. 1 is a perspective view of a wave soldering machine.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Wave soldering machines are typically designed to incorporate a series of pre-heaters which serve the purpose of heating a printed circuit board ("PCB") prior to contact with the molten solder bath. Some processes require that this heating be done in an oxygen-free environment. For these processes, the pre-heaters must be sealed with respect to a conveyor tunnel through which printed circuit boards travel so as to not allow infiltration of outside air. The pre-heater assembly of embodiments of the present disclosure incorporates a radiant curtain heating assembly that is configured to maintain an inert environment through the conveyor tunnel during pre-heating and soldering.

For purposes of illustration, and with reference to FIG. 1, embodiments of the present disclosure will now be described with reference to a wave soldering machine, generally indicated at 10, which is used to perform a solder application on a printed circuit board 12, which may be referred to herein as an electronic substrate. The wave soldering machine 10 is one of several machines in a printed circuit board fabrication/assembly line. As shown, the wave soldering machine 10 includes a housing 14 adapted to house the components of the machine. The arrangement is such that a conveyor 16 delivers printed circuit boards to be processed by the wave soldering machine 10. Upon entering the wave soldering machine 10, each printed circuit board 12 travels along an inclined path along the conveyor 16 through a tunnel 18, a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 27 is provided to automate the operation of the several stations of the wave soldering machine 10, including but not limited to the fluxing station 20, the pre-heating station 22, and the wave soldering station 24, in the well known manner.

Figure 2:
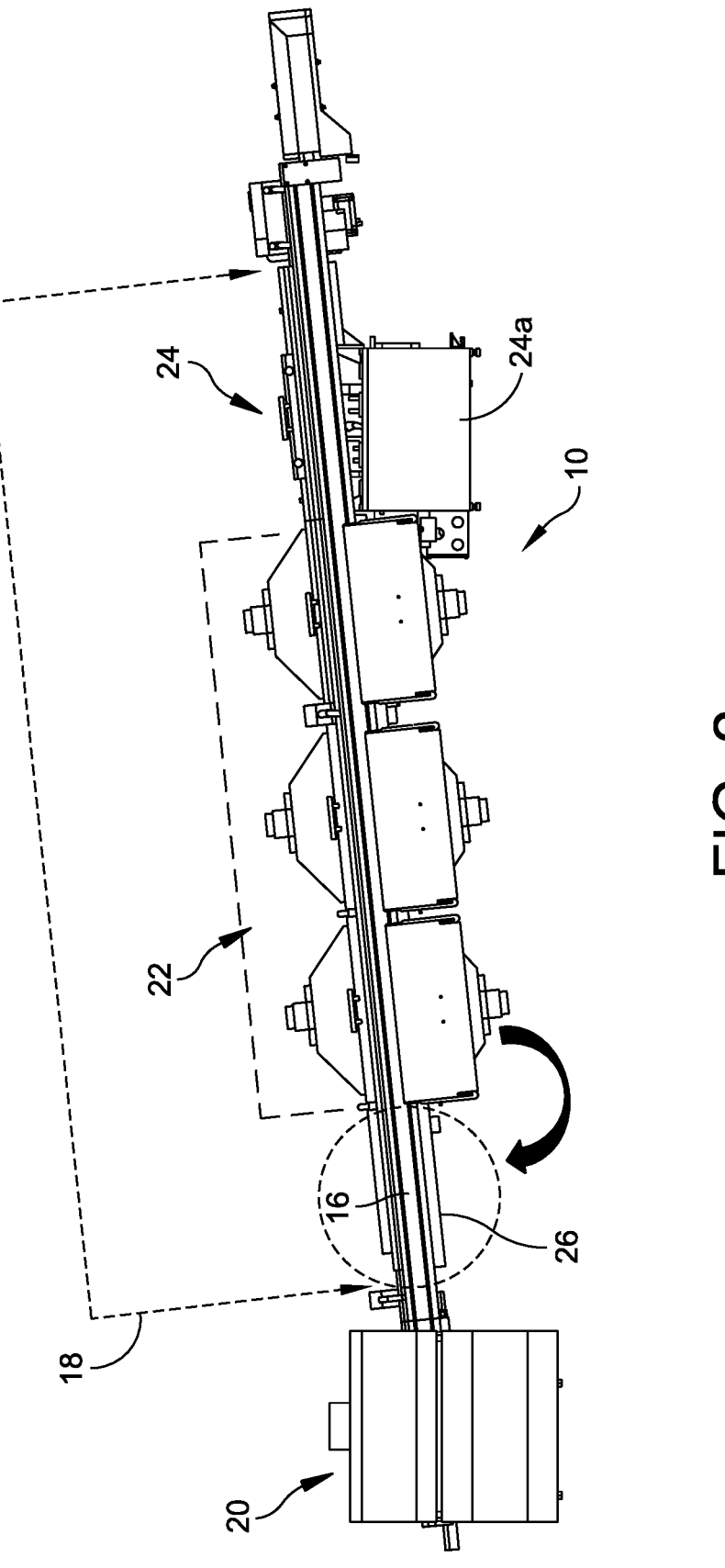
FIG. 2 is a side elevational view of the wave soldering machine with external packaging removed to reveal internal components of the wave soldering machine, including multiple pre-heater assemblies and a soldering station.

Referring to FIG. 2, the fluxing station 20 is configured to apply flux to the printed circuit board as it travels on the conveyor 16 through the wave soldering machine 10. The pre-heating station 22 includes several pre-heaters, which are designed to incrementally increase the temperature of the printed circuit board as it travels along the conveyor 16 through the tunnel 18 to prepare the printed circuit board for the wave soldering process. As shown, the wave soldering station 24 includes a wave solder nozzle in fluid communication with a reservoir 24a of solder material. A pump is provided within the reservoir to deliver molten solder material to the wave solder nozzle from the reservoir. Once soldered, the printed circuit board exits the wave soldering machine 10 via the conveyor 16 to another station provided in the fabrication line. In some embodiments, the wave soldering machine 10 may be further configured to include a flux management system to remove volatile contaminants from the tunnel 18 of the wave soldering machine.

To provide a desired gas environment in the tunnel 18, a curtain module, generally indicated at 26 in FIG. 2, is placed at an entrance of the tunnel 18. In some embodiments, a curtain module similar to the curtain module 26 may be placed at an exit of the tunnel 18.

Figure 3:
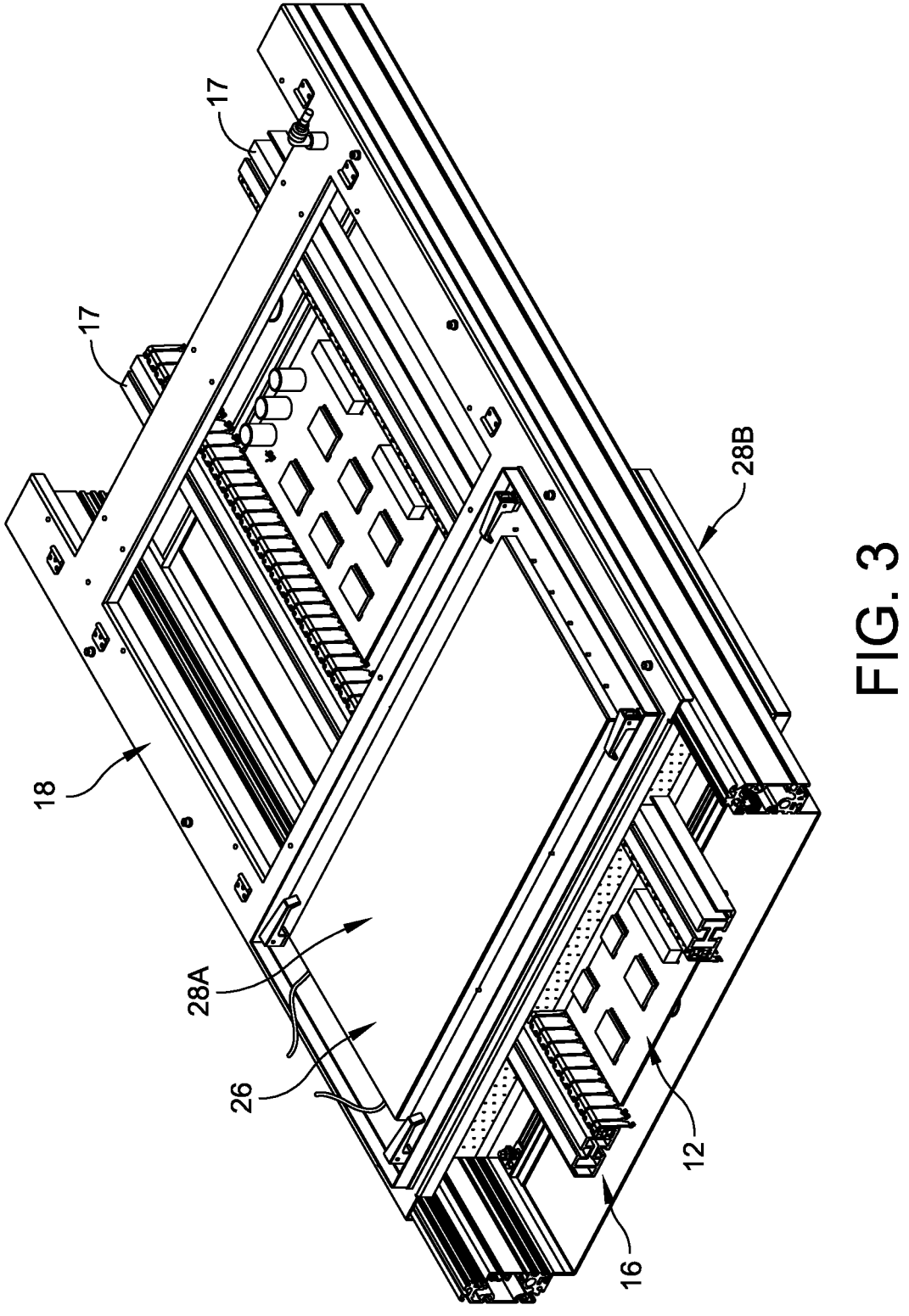
FIG. 3 is a perspective view of a curtain module of the present disclosure in a tunnel of the wave soldering machine.
Figure 4:
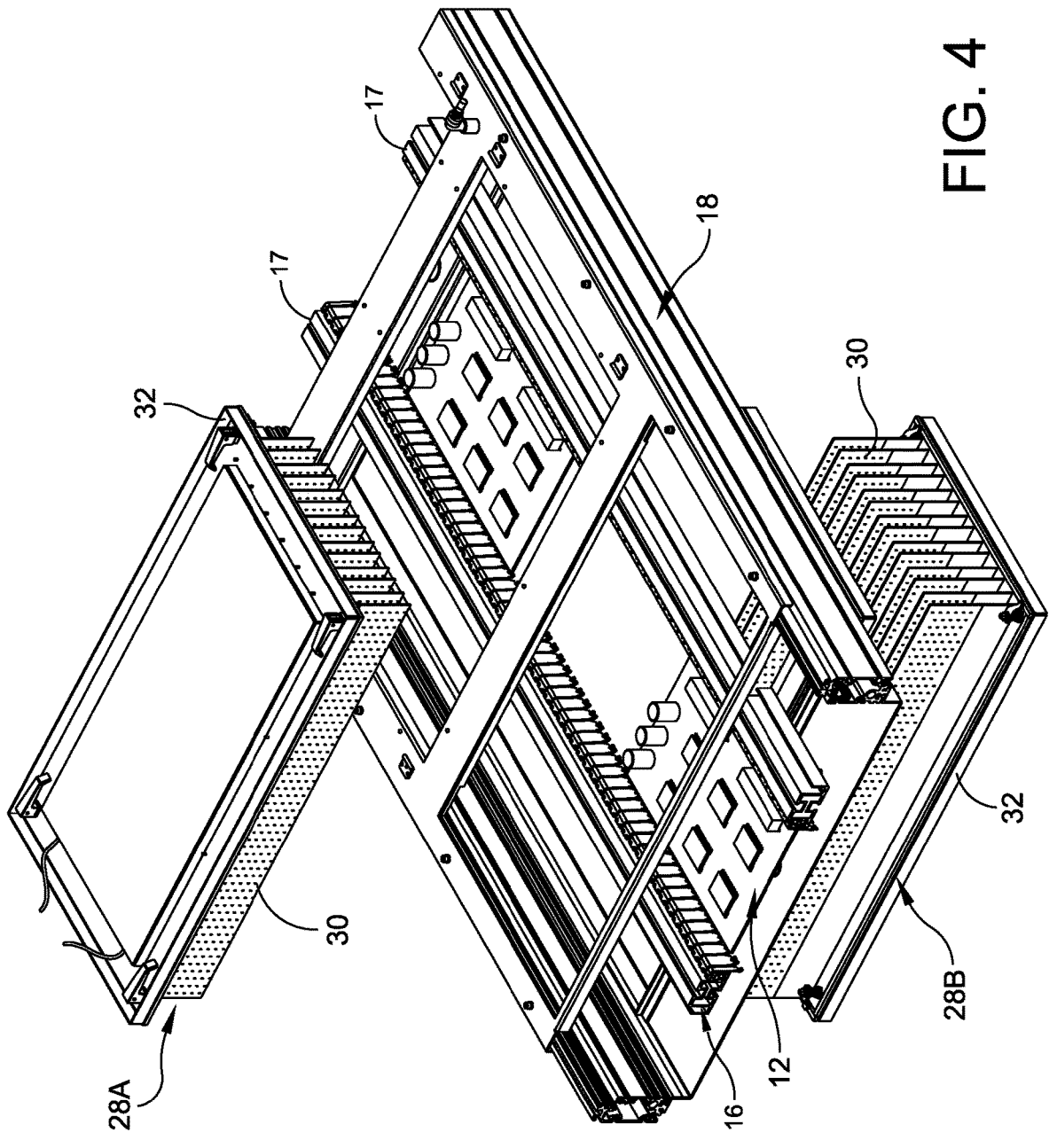
FIG. 4 is an exploded view of the curtain module of FIG. 3.

Referring now to FIGS. 3 and 4, an embodiment of the curtain module 26 includes an upper curtain subassembly 28A and a lower curtain subassembly 28B. The upper curtain subassembly 28A is mounted above the conveyor 16, which includes two spaced apart rails 17. The lower curtain subassembly 28B is mounted below the conveyor 16. The upper curtain subassembly 28A and the lower curtain subassembly 28B are configured to contain a desired gas environment along the conveyor within the tunnel 18. In some embodiments, the desired gas environment is an inert gas environment. In some embodiments, the inert gas is Nitrogen gas.

As shown in the exploded view of FIG. 4, the upper curtain subassembly 28A includes a plurality of curtains 30 depending downwardly from a mounting plate 32 towards the conveyor 16 and the lower curtain assembly 28B includes a plurality of curtains 30 extending upwardly from a mounting plate 32 towards the conveyor 16. The structure of each curtain module subassembly 28A, 28B is described in further detail below.

The mounting plate 32 of each curtain module subassembly 28A, 28B is secured to the structure forming the tunnel 18 of the wave soldering machine 10 in spaced apart facing relation with the conveyor 16.

Figure 5:
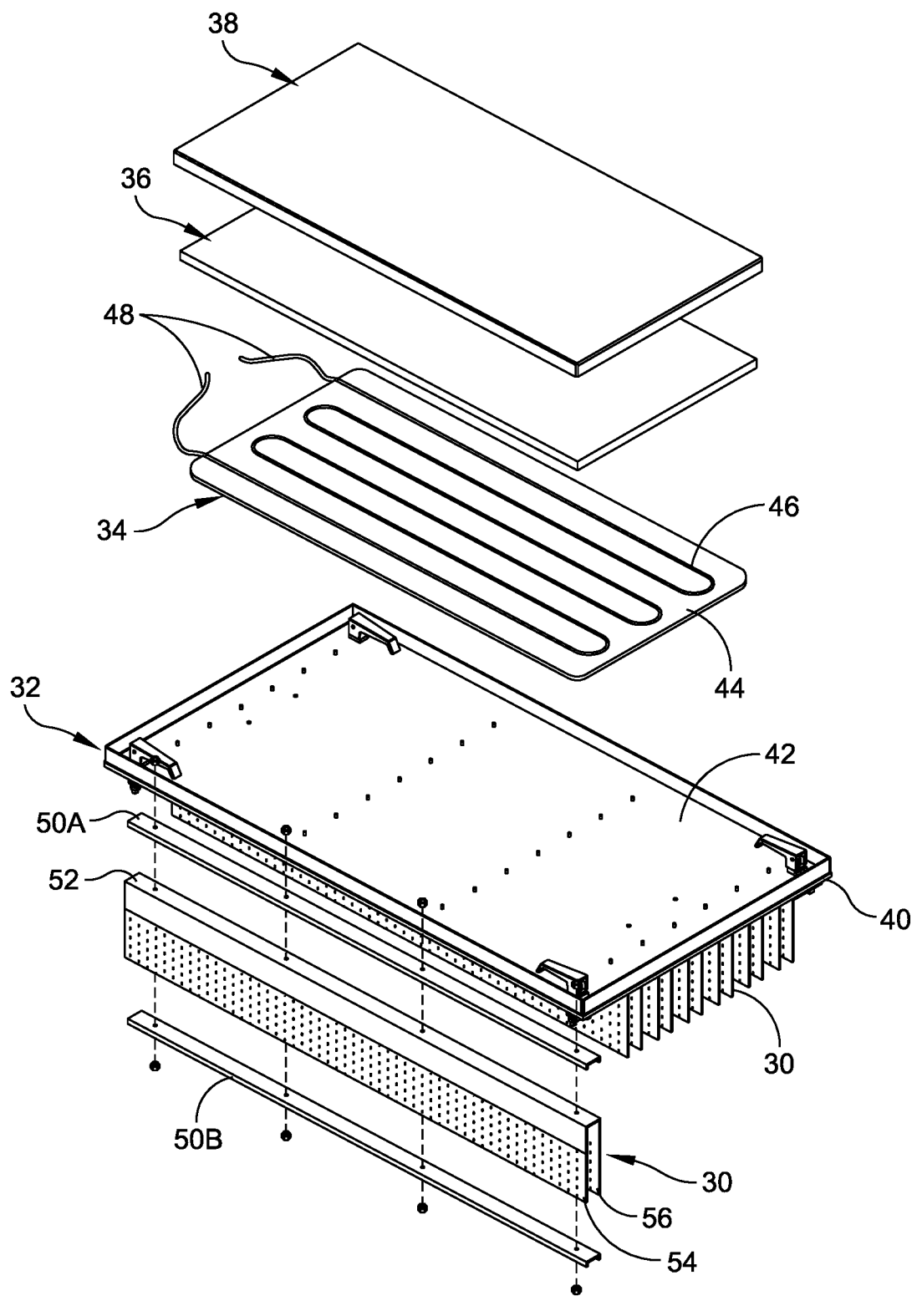
FIG. 5 is an exploded view of a subassembly of the curtain module of FIG. 3.

FIG. 5 shows an exploded view of the upper curtain subassembly 28A. A heating element 34 is secured to the mounting plate 32 on a side of the mounting plate opposite from the conveyor 16. An insulation layer 36 is secured to the heating element 34, and a cover 38 is secured over the insulation layer 36.

The structure of the lower curtain subassembly 28B is the same as the structure of the upper curtain subassembly 28A, but inverted.

The mounting plate 32 is secured to the structure forming the tunnel 18. The mounting plate 32 has a lower surface 40 and an upper surface 42. The mounting plate 32 is configured to support the plurality of curtains 30, which depend from the lower surface 40 of the mounting plate 32. Additionally, the mounting plate 32 is configured to support the heating element 34, which is supported on the upper surface 42 of the mounting plate 32, as well as the insulation 36 and the insulation cover 38 that are positioned on the heating element 34.

The mounting plate 32 is configured to conduct heat from the heating element 34 to the curtains 30. The mounting plate 32 is made of at least one thermally conductive material. For example, the mounting plate 32 may be made of materials including metal.

The heating element 34 of the curtain module subassembly is configured to heat a workpiece, e.g., printed circuit board 12, on the conveyor 16 as the workpiece passes through the curtain module 26 before the workpiece arrives at the preheat module 22. The heating element 34 of the curtain module subassembly assists in preheating the workpiece prior to entering the preheat module 22 thereby reducing the burden on the preheat module 22 to heat the workpiece to a desired temperature. Thus, the curtain module 26 allows the workpiece to spend less time in the preheat module 22 and travel at a greater speed on the conveyor through the wave soldering machine 10.

The heating element 34 is positioned on the upper surface 42 of the mounting plate 32. In some embodiments, the heating element 34 is secured to the mounting plate 32. For example, in some embodiments, the heating element 34 may be secured to the mounting plate 32 by a suitable fastener system, such as an adhesive or a clamp.

The heating element 34 may be made of various materials. In the embodiment of FIG. 5, the heating element 34 includes a sheet 44 made of silicone. In other embodiments, the sheet of the heating element may be made of silicone and/or one or more other materials.

In the embodiment of FIG. 5, the heating element 34 is electrically powered. The heating element includes an electric coil 46 extending through the sheet 44. The electric coil 46 includes a first electrical lead and a second electrical lead, each indicated at 48, which extend from the coil and out of the sheet. The first electrical lead 48 and the second electrical lead 48 may be connected to a voltage source (not shown) to create an electrical current through the coil 46 in the sheet. Application of the current to the electric coil 46 results in heat being released from the coil 46 into the sheet 44.

The insulation 36 and the insulation cover 38 provide thermal insulation of the heating element 34 so heat from the heating element 34 is conducted at least substantially or entirely through the mounting plate 32. The insulation 36 is positioned on an opposite surface of the heating element 34 from the mounting plate 32 so the insulation 36 is sandwiched between the heating element 34 and the insulation cover 38.

The insulation layer 36 has a thermal conductivity that results in desirable heating of the curtains 30. A lower thermal conductivity of the insulation layer 36 results in less heat transferred from the heating element 34 to the insulation cover 38, and a greater amount of heat transferred from the heating element 34 to the mounting plate 32, the curtains 30, and the workpiece (printed circuit board 12) beneath the curtains 30 of the upper subassembly 28A.

Similarly, a lower thermal conductivity of the insulation layer 36 results in less heat transferred from the heating element 34 to the insulation cover 38, and a greater amount of heat transferred from the heating element 34 to the mounting plate 32, the curtains 30, and the workpiece 12 above the curtains 30 of the lower subassembly 28B.

The insulation layer may be made from one or more materials that yield desirable heat conduction properties.

Turning now to the opposite side of the mounting plate 32, the curtains 30 are secured to the mounting plate by curtain retainers. Specifically, in the embodiment, two curtain retainers 50A, 50B secure each curtain 30 to the mounting plate. Each curtain retainer 50A, 50B is in the form of a longitudinally extending C-channel. The first curtain retainer 50A is secured to the lower surface 40 of the mounting plate 32, for example by a threaded fastener or a weld. To secure the curtain 30 to the mounting plate 32, the curtain 30 is bent into a U-shape over the second curtain retainer 50B. The curtain 30 and the second curtain retainer 50B are received in the C-channel of the first curtain retainer 50A. A fastener, such as a threaded fastener, extends through the second retainer 50B, through the curtain 30, through the first curtain retainer 50A and into the mounting plate 32. When the mounting plate 32 is positioned with its lower surface 40 extending horizontally, the free ends of each curtain extend downwardly from the lower surface of the mounting plate.

As noted above, each curtain 30 is bent over the curtain retainers 50A, 50B, with a middle portion 52 of each curtain 30 received between the two curtain retainers 50A. 50B to secure the curtain 30 to the mounting plate 32. Each curtain 30 extends from the fixed middle portion 52 to a first free end 54 of the curtain 30 and a second free end 56 of the curtain 30. In alternative embodiments, each curtain 30 includes a fixed end secured to the first side of the mounting plate and a single free end.

The first free end 54 and the second free end 56 are independently movable and independently bendable. Thus, as an electrical component travels through the tunnel 18 in a direction from the first free end 54 towards the second free end 56, the electrical component first contacts and bends the first free end 54, and next contacts and bends the second free end 56. In some embodiments, the ends 54, 56 of the curtain 30 bend just enough to accommodate the electrical component passing through the tunnel, thereby maintaining the desired gas environment in the tunnel 18. Due to the resilient nature of the curtain 30, each of the free ends 54, 56 returns to its original shape when no longer in contact with the electrical component passing through the tunnel.

Heat radiates from the mounting plate 32 towards the center of the tunnel 18. The insulation layer 36 described above increases the efficiency of the curtain module 26. The efficiency may be measured as the amount of heat that radiates to the center of the tunnel 18 compared to the amount of energy applied to the leads 48 of the heating element 34 of the curtain module 26.

Figure 6:
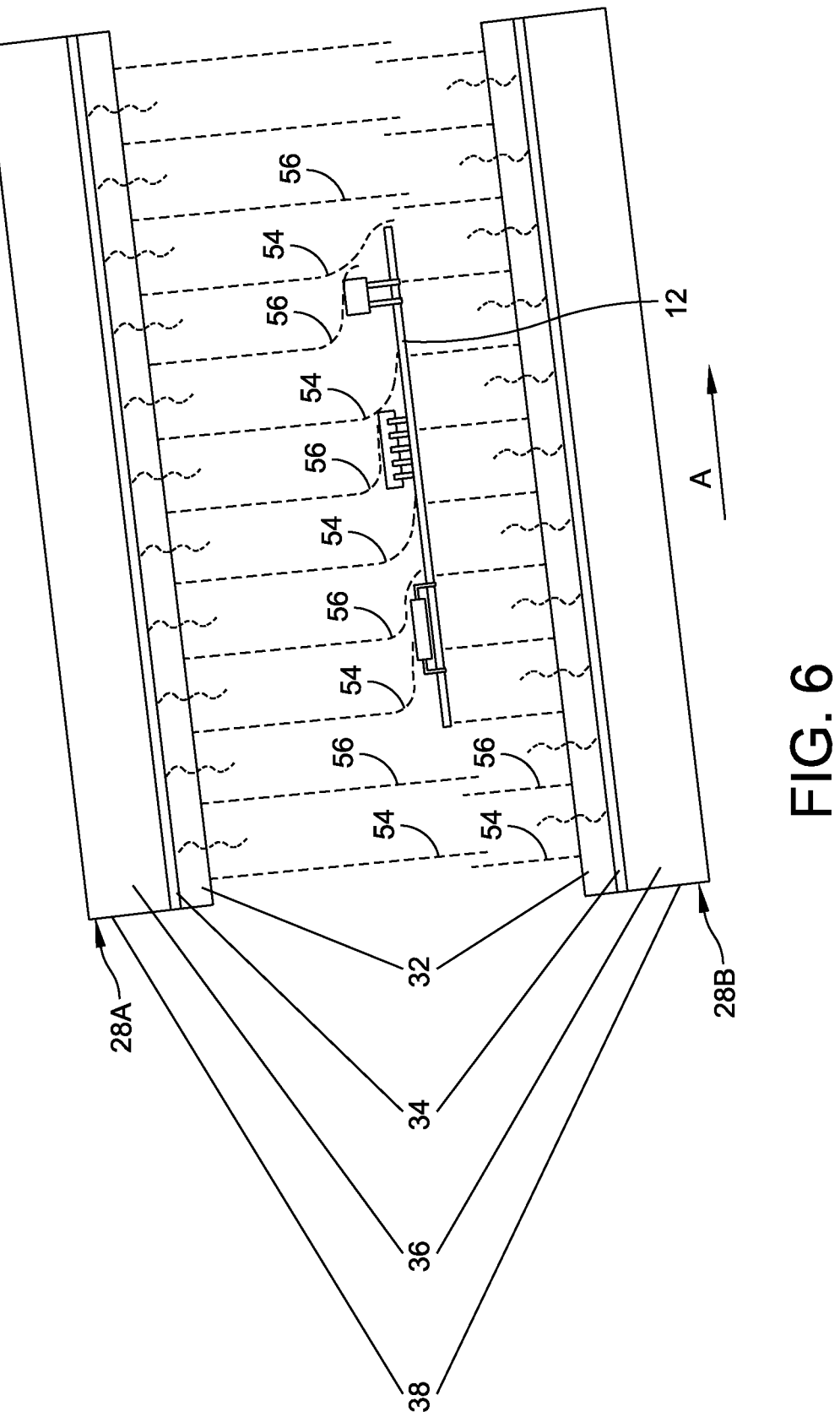
FIG. 6 is a schematic side view of a workpiece passing through the curtain module of FIG. 3.

Referring now to FIG. 6, each curtain 30 is made of a material that is sufficiently flexible to allow the curtain 30 to accommodate a workpiece having electrical components passing through the tunnel 18 on the conveyor 16. The curtains 30 of the upper subassembly 28a and the curtains 30 of the lower subassembly 28B engage the rails 17 and, between the rails 17, overlap each other in a vertical direction to create a gas barrier within the tunnel 18. As shown in FIG. 6, before an electrical component passes one of the curtains 30, the free ends 54, 56 of the respective curtain overlap each other in a vertical direction to create a gas barrier along the tunnel 18. As a workpiece passes between the upper and lower curtain subassemblies 28A, 28B along the direction of arrow A, the free ends 54, 56 of one of the curtains 30 of the upper subassembly 28A bend to accommodate the electrical component. After the electrical component passes the free ends 54, 56 of the respective curtain 30, the free ends 54, 56 of the respective curtain 30 return to their original shape, thereby maintaining the desired inert gas environment in the tunnel.

In some embodiments, each curtain is made of a material including fiberglass. In some embodiments, each curtain is made of a material including fiberglass coated in polytetrafluoroethylene (PTFE).

In some embodiments of the present disclosure, a curtain module may be provided separately from a wave soldering machine or a reflow oven.

Another aspect of the present disclosure is directed to a method of containing an inert gas around a conveyor in a tunnel, such as a tunnel of a wave soldering machine or a reflow oven.

Figure 7:
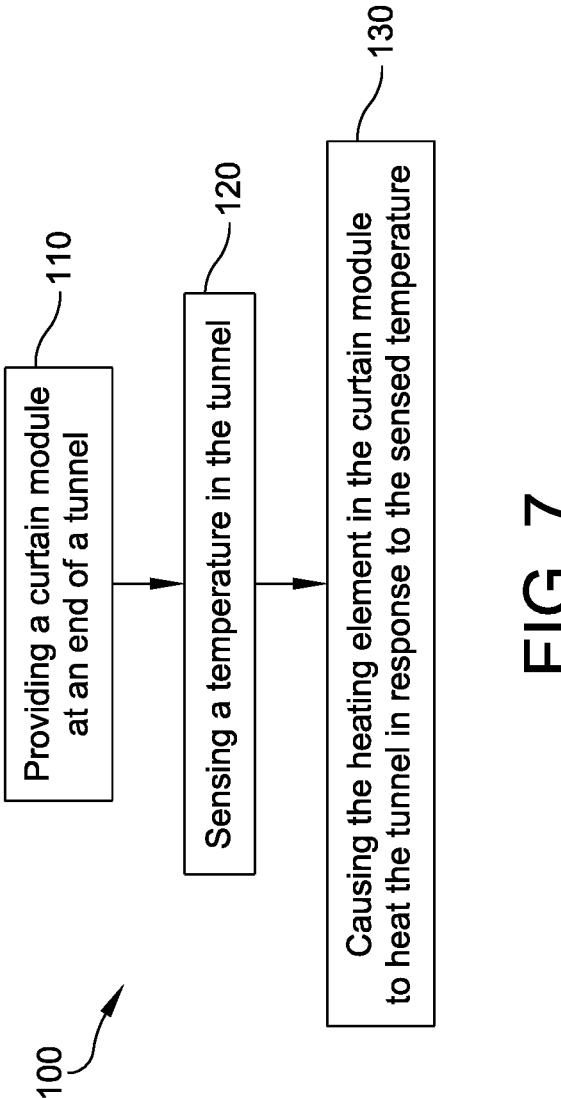
FIG. 7 is a flowchart of an embodiment of a method of controlling a temperature in a tunnel, such as a tunnel of a wave soldering machine or a reflow oven.

FIG. 7 shows an embodiment of a method 100 of containing an inert gas around a conveyor in a tunnel. At block 110, the method includes providing a curtain module of the present disclosure at an end of the tunnel. The curtain module includes at least one curtain and at least one heating element.

The method further includes controlling a temperature of the heating element. For example, in some embodiments, the method includes causing the controller 27 to send a signal to the heating element to cause the heating element to generate heat to heat the tunnel to a desired temperature. In some embodiments, the signal sent from the controller 27 to the heating element may be in response to a signal received by the controller 27 from one or more temperature sensors in the tunnel.

At block 120, the method includes sensing a temperature in the tunnel. At block 130, the method includes causing a heating element in the curtain module to heat the tunnel.

In some embodiments of the method, the heating element is a radiant heating element.

In some embodiments of the method, the at least one curtain module includes an upper curtain module subassembly positioned above the conveyor and a lower curtain module subassembly positioned below the conveyor. The upper curtain module subassembly includes a first heating element and the lower curtain module subassembly includes a second heating element of the at least one heating element. The method includes controlling a first temperature of the first heating element and controlling a second temperature of the second heating element. The first temperature and the second temperature may be selectively equal or unequal.

Although some portions of the above description relate to a wave soldering machine, embodiments of the curtain module of the present disclosure and embodiments of the method of the present disclosure may be used with other devices, such as a reflow oven. For example, radiant curtain modules can be provided at the entrance and the exit of the tunnel of the reflow oven in a manner similar to the placement of the radiant curtain modules at the entrance and the exit of the tunnel of the wave soldering machine.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave soldering machine comprising:
   a housing including a tunnel;
   a conveyor extending through the tunnel, the conveyor being configured to move workpieces through the tunnel;
   a preheat module positioned along the tunnel;
   a curtain module positioned at an entrance of the tunnel, the curtain module including
      an upper curtain module subassembly positioned above the conveyor, the upper curtain module subassembly including at least one first curtain and a first heating element, and
      a lower curtain module subassembly positioned below the conveyor, the lower curtain module subassembly including at least one second curtain and a second heating element; and
   a controller configured to control a first temperature of the first heating element and control a second temperature of the second heating element,
   wherein the first temperature and the second temperature are not equal.

2. The wave soldering machine of claim 1, wherein the upper curtain module subassembly further includes a first mounting plate, each curtain of the at least one first curtain being secured to the first mounting plate, and the first heating element being secured to the first mounting plate, and
   the lower curtain module subassembly further includes a second mounting plate, each curtain of the at least one second curtain being secured to the second mounting plate, and the second heating element being secured to the second mounting plate.

3. The wave soldering machine of claim 2, wherein each of the first heating element and the second heating element is a radiant heating element.

4. The wave soldering machine of claim 2, wherein the upper curtain module subassembly further includes first insulation layer, wherein the first heating element is positioned between the first insulation layer and the first mounting plate, and
   the lower curtain module subassembly further includes a second insulation layer, wherein the second heating element is positioned between the second insulation layer and the second mounting plate.

5. The wave soldering machine of claim 4, wherein the upper curtain module subassembly further includes a first insulation cover, wherein the first insulation layer is positioned between the first insulation cover and the first heating element, and
   the lower curtain module subassembly further includes a second insulation cover, wherein the second insulation layer is positioned between the second insulation cover and the second heating element.

6. The wave soldering machine of claim 2, wherein the first mounting plate has a first side and a second side opposite the first side, and each curtain of the at least one first curtain is secured to the first side of the first mounting plate and the first heating element is secured to the second side of the first mounting plate, and the second mounting plate has a first side and a second side opposite the first side, and each curtain of the at least one second curtain is secured to the first side of the second mounting plate and the second heating element is secured to the second side of the second mounting plate.

7. The wave soldering machine of claim 6, wherein each of the first heating element and the second heating element is a radiant heating element.

8. The wave soldering machine of claim 6, wherein each of the at least one first curtain and the at least one second curtain includes a plurality of curtains.

9. The wave soldering machine of claim 6, wherein each curtain of the at least one first curtain is secured to the first mounting plate by at least one first curtain retainer extending along a length of the respective curtain, and each curtain of the at least one second curtain is secured to the second mounting plate by at least one second curtain retainer extending along a length of the respective curtain.

10. The wave soldering machine of claim 1, wherein a curtain of the at least one first curtain of the upper curtain module subassembly overlaps a curtain of the at least one second curtain of the lower curtain module subassembly.

11. The wave soldering machine of claim 1, wherein each curtain of the at least one first curtain and the at least one second curtain is made of a material including fiberglass.

12. A curtain module for a wave soldering machine or a reflow oven, the curtain module comprising:

an upper curtain module subassembly positioned above a conveyor, the upper curtain module subassembly including at least one first curtain and a first heating element; and a lower curtain module subassembly positioned below the conveyor, the lower curtain module subassembly including at least one second curtain and a second heating element, wherein the first heating element of the upper curtain module subassembly is configured to be controlled by a controller to achieve a first temperature and the second heating element of the lower curtain module subassembly is configured to be controlled by the controller to achieve a second temperature, and wherein the first temperature and the second temperature are not equal.

13. The curtain module of claim 12, further comprising a first mounting plate, each curtain of the at least one first curtain being secured to the first mounting plate, and the first heating element being secured to the first mounting plate, and a second mounting plate, each curtain of the at least one second curtain being secured to the second mounting plate, and the second heating element being secured to the second mounting plate.

14. The curtain module of claim 13, wherein each of the first heating element and the second heating element is a radiant heating element.

15. The curtain module of claim 13, further comprising a first insulation layer, wherein the first heating element is positioned between the first insulation layer and the first mounting plate, and a second insulation layer, wherein the second heating element is positioned between the second insulation layer and the second mounting plate.

16. The curtain module of claim 15, further comprising a first insulation cover, wherein the first insulation layer is positioned between the first insulation cover and the first heating element, and a second insulation cover, wherein the second insulation layer is positioned between the second insulation cover and the second heating element.

17. The curtain module of claim 13, wherein the first mounting plate has a first side and a second side opposite the first side, and each curtain of the at least one first curtain is secured to the first side of the mounting plate and the first heating element is secured to the second side of the first mounting plate, and the second mounting plate has a first side and a second side opposite the first side, and each curtain of the at least one second curtain is secured to the first side of the second mounting plate and the second heating element is secured to the second side of the second mounting plate.

18. The curtain module of claim 17, wherein each of the first heating element and the second heating element is a radiant heating element.

19. The curtain module of claim 17, wherein each of the at least one first curtain and the at least one second curtain includes a plurality of curtains.

20. The curtain module of claim 17, wherein each curtain of the at least one curtain of the at least one first curtain is secured to the first mounting plate by at least one first curtain retainer extending along a length of the respective curtain, and each curtain of the at least one second curtain is secured to the second mounting plate by at least one second curtain retainer extending along a length of the respective curtain.

21. The curtain module of claim 12, wherein a curtain of the at least one first curtain of the upper curtain module subassembly overlaps a curtain of the at least one second curtain of the lower curtain module subassembly.

22. The curtain module of claim 12, wherein each curtain of the at least one first curtain and the at least one second curtain is made of a material including fiberglass.

23. A method of containing an inert gas around a conveyor in a tunnel of a wave soldering machine or a reflow oven, the method comprising:

providing a curtain module at an end of the tunnel, the curtain module including at least one curtain and at least one heating element; and controlling a temperature of the at least one heating element, wherein the curtain module includes an upper curtain module subassembly positioned in the tunnel above the conveyor and including a first heating element of the at least one heating element, and a lower curtain module subassembly positioned in the tunnel below the conveyor and including a second heating element of the at least one heating element, wherein controlling the temperature of the heating element includes controlling a first temperature of the first heating element and controlling a second temperature of the second heating element, and wherein the first temperature and the second temperature are not equal.

24. The method of claim 23, wherein each of the first heating element and the second heating element is a radiant heating element.

* * * * *